US008791508B2

(12) United States Patent
Roberts et al.

(10) Patent No.: US 8,791,508 B2
(45) Date of Patent: Jul. 29, 2014

(54) HIGH DENSITY GALLIUM NITRIDE DEVICES USING ISLAND TOPOLOGY

(75) Inventors: John Roberts, Ottawa (CA); Ahmad Mizan, Ottawa (CA); Girvan Patterson, Ottawa (CA); Greg Klowak, Ottawa (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 13/641,003

(22) PCT Filed: Apr. 13, 2011

(86) PCT No.: PCT/CA2011/000396
§ 371 (c)(1),
(2), (4) Date: Nov. 15, 2012

(87) PCT Pub. No.: WO2011/127568
PCT Pub. Date: Oct. 20, 2011

(65) Prior Publication Data
US 2013/0049010 A1    Feb. 28, 2013

Related U.S. Application Data

(60) Provisional application No. 61/323,470, filed on Apr. 13, 2010.

(51) Int. Cl.
| | | |
|---|---|---|
| *H01L 23/528* | (2006.01) | |
| *H01L 29/417* | (2006.01) | |
| *H01L 29/423* | (2006.01) | |
| H01L 21/8252 | (2006.01) | |
| H01L 27/06 | (2006.01) | |
| H01L 29/20 | (2006.01) | |
| H01L 23/00 | (2006.01) | |
| H01L 29/40 | (2006.01) | |
| H01L 27/085 | (2006.01) | |

(52) U.S. Cl.
CPC . *H01L 29/42316* (2013.01); *H01L 2924/13091* (2013.01); *H01L 29/41725* (2013.01); *H01L 2924/13055* (2013.01); H01L 27/0605 (2013.01); H01L 29/2003 (2013.01); H01L 2224/05644 (2013.01); H01L 24/13 (2013.01); H01L 2224/13144 (2013.01); H01L 29/402 (2013.01); H01L 27/085 (2013.01); H01L 2224/05572 (2013.01); H01L 24/05 (2013.01); H01L 27/0629 (2013.01)
USPC .......... 257/206; 257/200; 257/208; 257/365; 257/390; 257/E21.405; 438/129; 438/604

(58) Field of Classification Search
CPC ............................. H01L 2224/48698; H01L 2224/73–2224/73153; H01L 29/4791; H01L 29/42372–29/42392; H01L 29/2003; H01L 29/402; H01L 2924/13091; H01L 2924/13055; H01L 27/0629; H01L 2224/05572; H01L 29/41725; H01L 24/05–24/06; H01L 24/13–24/14
USPC .......... 257/76, 192, 194–195, 200, 206, 208, 257/213, 288–289, 365, 369, 390, E29.246, 257/E29.252, E21.403, E21.405, E21.407, 257/E29.249; 438/128–129, 167, 172, 587, 438/604
See application file for complete search history.

(56) References Cited

U.S. PATENT DOCUMENTS

| | | | | |
|---|---|---|---|---|
| 3,783,349 | A | * | 1/1974 | Beasom ........................ 257/287 |
| 4,152,714 | A | | 5/1979 | Hendrickson et al. |
| 4,636,825 | A | * | 1/1987 | Baynes ........................ 257/401 |
| 4,819,042 | A | | 4/1989 | Kaufman |
| 4,821,084 | A | * | 4/1989 | Kinugasa et al. ............. 257/288 |
| 5,087,950 | A | | 2/1992 | Katano |
| 5,355,008 | A | | 10/1994 | Moyer et al. |
| 5,447,876 | A | * | 9/1995 | Moyer et al. .................. 438/105 |
| 5,643,832 | A | | 7/1997 | Kim |
| 5,714,784 | A | | 2/1998 | Ker et al. |
| 5,767,546 | A | | 6/1998 | Williams et al. |
| 5,789,791 | A | | 8/1998 | Bergemont |
| 5,852,315 | A | * | 12/1998 | Ker et al. ...................... 257/355 |
| 6,037,822 | A | | 3/2000 | Rao et al. |
| 6,084,266 | A | * | 7/2000 | Jan ................................ 257/341 |
| 6,264,167 | B1 | | 7/2001 | Hamazawa |

| | | | |
|---|---|---|---|
| 6,353,290 B1 | 3/2002 | Glenn et al. | |
| 6,388,292 B1* | 5/2002 | Lin | 257/356 |
| 6,477,023 B1 | 11/2002 | Tang et al. | |
| 6,555,873 B2 | 4/2003 | Disney et al. | |
| 6,639,277 B2 | 10/2003 | Rumennik et al. | |
| 6,653,740 B2 | 11/2003 | Kinzer et al. | |
| 6,713,823 B1* | 3/2004 | Nickel | 257/401 |
| 6,737,714 B2* | 5/2004 | Masuda et al. | 257/401 |
| 6,777,278 B2 | 8/2004 | Smith | |
| 6,897,561 B2* | 5/2005 | Nemtsev et al. | 257/758 |
| 6,903,460 B2* | 6/2005 | Fukuda et al. | 257/758 |
| 6,930,329 B2 | 8/2005 | Koide | |
| 6,958,543 B2* | 10/2005 | Nakayama | 257/758 |
| 7,033,936 B1 | 4/2006 | Green | |
| 7,078,775 B2 | 7/2006 | Yi et al. | |
| 7,132,717 B2 | 11/2006 | Su et al. | |
| 7,166,898 B2* | 1/2007 | Briere | 257/401 |
| 7,233,028 B2 | 6/2007 | Weeks et al. | |
| 7,233,610 B2 | 6/2007 | Lan et al. | |
| 7,250,641 B2* | 7/2007 | Saito et al. | 257/192 |
| 7,253,486 B2 | 8/2007 | Green et al. | |
| 7,294,892 B2* | 11/2007 | Chen | 257/401 |
| 7,327,007 B2 | 2/2008 | Shimizu | |
| 7,335,916 B2 | 2/2008 | Kim et al. | |
| 7,352,016 B2 | 4/2008 | Nagy et al. | |
| 7,449,762 B1 | 11/2008 | Singh | |
| 7,491,986 B2* | 2/2009 | Kumagae et al. | 257/203 |
| 7,550,821 B2 | 6/2009 | Shibata et al. | |
| 7,622,318 B2 | 11/2009 | Kobayashi et al. | |
| 7,727,332 B2 | 6/2010 | Habel et al. | |
| 7,732,306 B2 | 6/2010 | Arena et al. | |
| 7,750,369 B2 | 7/2010 | Ohta et al. | |
| 8,134,205 B2* | 3/2012 | Tang et al. | 257/341 |
| 2001/0015447 A1 | 8/2001 | Shinomiya | 257/203 |
| 2002/0013042 A1 | 1/2002 | Morkoc | |
| 2002/0076851 A1* | 6/2002 | Eden et al. | 438/106 |
| 2002/0179005 A1 | 12/2002 | Koike et al. | |
| 2002/0197841 A1 | 12/2002 | Nagai et al. | |
| 2003/0032288 A1 | 2/2003 | Kozaki et al. | |
| 2003/0062622 A1* | 4/2003 | Pavier et al. | 257/734 |
| 2003/0136984 A1* | 7/2003 | Masuda et al. | 257/247 |
| 2003/0183160 A1 | 10/2003 | Fujikura et al. | |
| 2004/0048409 A1 | 3/2004 | Biwa et al. | |
| 2005/0056865 A1 | 3/2005 | Tsuchiya et al. | |
| 2005/0093099 A1 | 5/2005 | Koike et al. | |
| 2005/0274977 A1 | 12/2005 | Saito et al. | |
| 2006/0049417 A1 | 3/2006 | Li et al. | |
| 2007/0096262 A1 | 5/2007 | Takasone | |
| 2008/0073670 A1 | 3/2008 | Yang et al. | |
| 2008/0087915 A1* | 4/2008 | Uemoto et al. | 257/192 |
| 2008/0128752 A1 | 6/2008 | Wu | |
| 2008/0149940 A1* | 6/2008 | Shibata et al. | 257/76 |
| 2008/0173898 A1 | 7/2008 | Ohmaka | |
| 2008/0246058 A1* | 10/2008 | Nagy et al. | 257/192 |
| 2008/0303042 A1 | 12/2008 | Minato et al. | |
| 2009/0045394 A1 | 2/2009 | Smeeton et al. | |
| 2009/0086506 A1 | 4/2009 | Okumura | |
| 2009/0242961 A1 | 10/2009 | Tang et al. | |
| 2010/0019850 A1* | 1/2010 | Nagy et al. | 330/277 |
| 2010/0072489 A1 | 3/2010 | McLaurin et al. | |
| 2010/0072576 A1 | 3/2010 | Arena | |
| 2010/0163979 A1 | 7/2010 | Hebert | |
| 2010/0258843 A1 | 10/2010 | Lidow et al. | |
| 2010/0297960 A1* | 11/2010 | Ogawa et al. | 455/83 |
| 2011/0031529 A1 | 2/2011 | Miura et al. | |
| 2011/0031532 A1* | 2/2011 | Kikkawa et al. | 257/194 |
| 2011/0079795 A1* | 4/2011 | Nagai | 257/77 |
| 2011/0115029 A1* | 5/2011 | Van Den Boom | 257/369 |
| 2011/0186858 A1* | 8/2011 | Roberts et al. | 257/76 |
| 2011/0193096 A1* | 8/2011 | Imada | 257/76 |
| 2012/0126290 A1* | 5/2012 | Uemoto et al. | 257/192 |
| 2012/0138950 A1* | 6/2012 | Roberts et al. | 257/76 |
| 2012/0315743 A1* | 12/2012 | Kikkawa et al. | 438/478 |

FOREIGN PATENT DOCUMENTS

| | | |
|---|---|---|
| CA | 2351368 A1 | 3/2001 |
| EP | 1973163 | 9/2008 |
| EP | 2151852 | 2/2010 |
| WO | 2010015302 | 2/2010 |
| WO | 2011014951 A1 | 2/2011 |

OTHER PUBLICATIONS

Wai Tung NG et al. High Speed CMOS output Stage for integrated DC_DC Converters. Solid state and Integrated Circuit Technology 2008. ICSICT 2009. pp. 1909-1912.

A.Yoo et al. High Performance Low_Voltage Powers MOSFETs with Hybrid Waffle Layout Structure in a 0.25 um Standard CMOS process. 20th International Symposium on Power Semiconductor Devices and ICs (ISPD '08). p. 95 (2008).

S. Lee. Distributed effects on power transistors and the optimization of the layouts of AlGaN/GaN HFETs, Doctoral dissertation, Graduate School of Ohio State University, Ohio State University. (2006).

Sang Lam et al. An enhanced compact waffle MOSFET with low drain capacitance from a standard submicron CMOS technology. Solid State Electronics 47(2003). Pergamon Press. pp. 785-789.

R. Vemuru. Layout Comparison of MOSFETs with large W/L ratios. Electronic Letters. vol. 28. No. 25. pp. 2327-2329. (1992).

L Baker et al. A waffle layout technique strengthens the ESD hardness of the NMOS transistor. EOS/ESD Symp. Proc. EOS-11. pp. 175-181. (1989).

Ming-Dou Ker et al. Area-Efficient Layout Design for CMOS Output Transistors. IEEE Transactions on Electron Devices. vol. 44. No. 4. Apr. 1997.

\* cited by examiner

*Primary Examiner* — Laura Menz
*Assistant Examiner* — Maliheh Malek

(57) ABSTRACT

A Gallium Nitride (GaN) series of devices—transistors and diodes are disclosed—that have greatly superior current handling ability per unit area than previously described GaN devices. The improvement is due to improved layout topology. The devices also include a simpler and superior flip chip connection scheme and a means to reduce the thermal resistance. A simplified fabrication process is disclosed and the layout scheme which uses island electrodes rather than finger electrodes is shown to increase the active area density by two to five times that of conventional interdigitated structures. Ultra low on resistance transistors and very low loss diodes can be built using the island topology. Specifically, the present disclosure provides a means to enhance cost/effective performance of all lateral GaN structures.

14 Claims, 12 Drawing Sheets

HIGH DENSITY GALLIUM NITRIDE DEVICES USING ISLAND TOPOLOGY

TECHNICAL FIELD

The present disclosure relates to gallium nitride semiconductors—transistors and diodes. More particularly, the disclosure relates to power devices that are required to provide high current capability.

BACKGROUND

Gallium nitride-based power semiconductor devices are well known to have properties that are desirable for power applications. Most of the proposed structures are lateral conductive devices which have power electrodes and control electrodes disposed along the top surface of the devices. Just below the electrodes, a hetero structure of aluminium gallium nitride (AlGaN) and gallium nitride (GaN), charges are generated at a hetero interface due to spontaneous polarization and piezoelectric polarization so that sheet carrier density of $1 \times 10^{13}$ cm$^{-2}$ or higher is obtained with no intentionally added impurities. As a result a high current density heterojunction field effect transistor (HFET) can be implemented by using a two-dimensional electron gas (2 DEG) generated at the heterointerface.

Nitride semiconductor-based power transistors have therefore been widely investigated and developed, and an on-resistance as low as one tenth or less of a Si-based metal oxide semiconductor field effect transistor (MOSFET) and one third or less of an insulated gate bipolar transistor (IGBT) has been implemented in the fields that require a breakdown voltage of 200 V or higher (e.g., see W. Saito et al., "IEEE Transactions on Electron Devices," 2003, Vol. 50, No. 12, p. 2528). In a nitride semiconductor device, the size of an active region can be made smaller than in a Si-based semiconductor device. Therefore, reduction in size of the semiconductor device has also been expected for the nitride semiconductor device.

In a conventional nitride semiconductor device, the size of the active region can be reduced to about one third to about one tenth of the size of the active region of a Si-based semiconductor device. However, since an electrode pad for connecting wirings occupies a large area, the size of the current carrying interconnect tracks of lateral nitride semiconductor devices cannot be reduced sufficiently because of electromigration issues.

For example, a nitride semiconductor device shown in FIG. 11 has a drain electrode pad 125 connected to drain electrodes 118, a source electrode pad 126 connected to source electrodes 117, and a gate electrode pad 129 connected to gate electrodes 119. In this case, the area required for the nitride semiconductor device is about three times as large as the area of an active region 130. It is possible to reduce the size of an electrode pad, but such reduction in size of the electrode pad is limited in view of the yield.

It is also possible to form an electrode pad over the active region. In a nitride semiconductor device, however, a channel through which electrons drift extends in a direction parallel to a main surface of a substrate. Therefore, not only a gate electrode but a source electrode and a drain electrode are formed over the active region. In a power device, for example, a voltage of several hundreds of volts is applied between the drain electrode pad and the source electrode. It is therefore difficult to assure insulation between the drain electrode pad and the source electrode with a normal interlayer insulating film.

Moreover, in the case where an electrode pad is formed over the active region in the multi-finger nitride semiconductor device as shown in FIG. 11, the electrode pad and an electrode formed right under the electrode pad need to be connected to each other through a special plug or via. It is therefore difficult to connect the pad and also to assure the flatness of the electrode pad.

SUMMARY

Accordingly, it is desirable to eliminate the electromigration, electrode pad area problems, electrical interconnect area problems, and the limited active area deficiencies. To overcome these issues and the other disadvantages of the prior art, the present disclosure provides new constructions and topologies in a GaN semiconductor device.

More specifically it is proposed that islands, either triangular or rectangular island structures are used in place of the common multi-finger or interdigitated structure. These new island topologies can easily result in the so called specific transistor resistance being less than half those achieved by equivalent area multi-finger layouts. More significantly the effective or active area ratios are 3 to 5 times superior because of the reduced surface interconnect and pad requirements.

The present disclosure provides a device with a larger gate width (commonly known as Wg), within a given active area. In certain exemplary embodiments, there is provided topologies for diodes and transistors that greatly increase the current handling capability per unit overall device area rather than just within the active area. In addition, there is provided a simple process to fabricate extremely capable GaN transistors and diodes.

The foregoing summarizes the principal features and some optional aspects. A further understanding may be had by the description of the examples which follow.

DETAILED DESCRIPTION

Within the present disclosure, use of the words electrode, island and island electrode, when in reference to source, drain, anode or cathode, may be used interchangeably and portray the same meaning and intent.

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments. The features illustrated or described in connection with one exemplary embodiment may be combined with the features of other embodiments. Such modifications and variations are intended to be included within the scope of the present disclosure.

Wherever ranges of values are referenced within this specification, sub-ranges therein are intended to be included unless otherwise indicated. Where characteristics are attributed to one or another variant, unless otherwise indicated, such characteristics are intended to apply to all other variants where such characteristics are appropriate or compatible with such other variants.

Example 1

Figure 1:
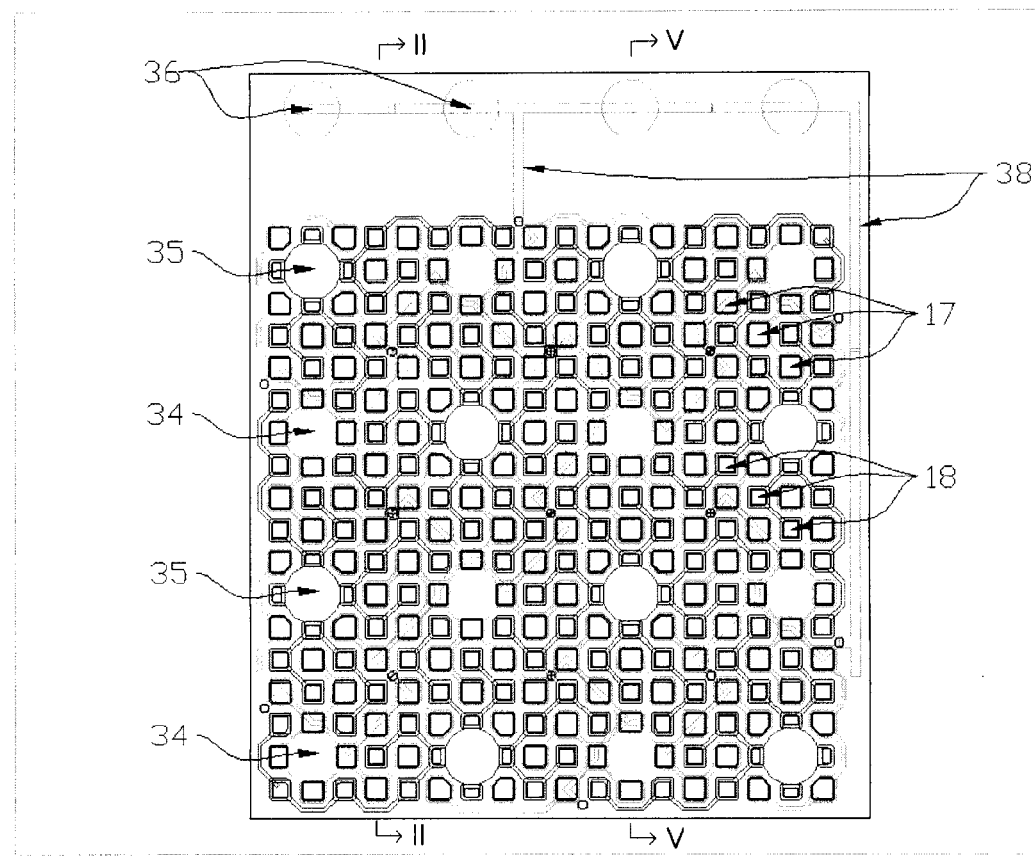
FIG. 1 is a plan view of a nitride semiconductor device according to one exemplary embodiment.

FIG. 1 shows a planar structure of a nitride semiconductor device of an exemplary embodiment.

Figure 2:
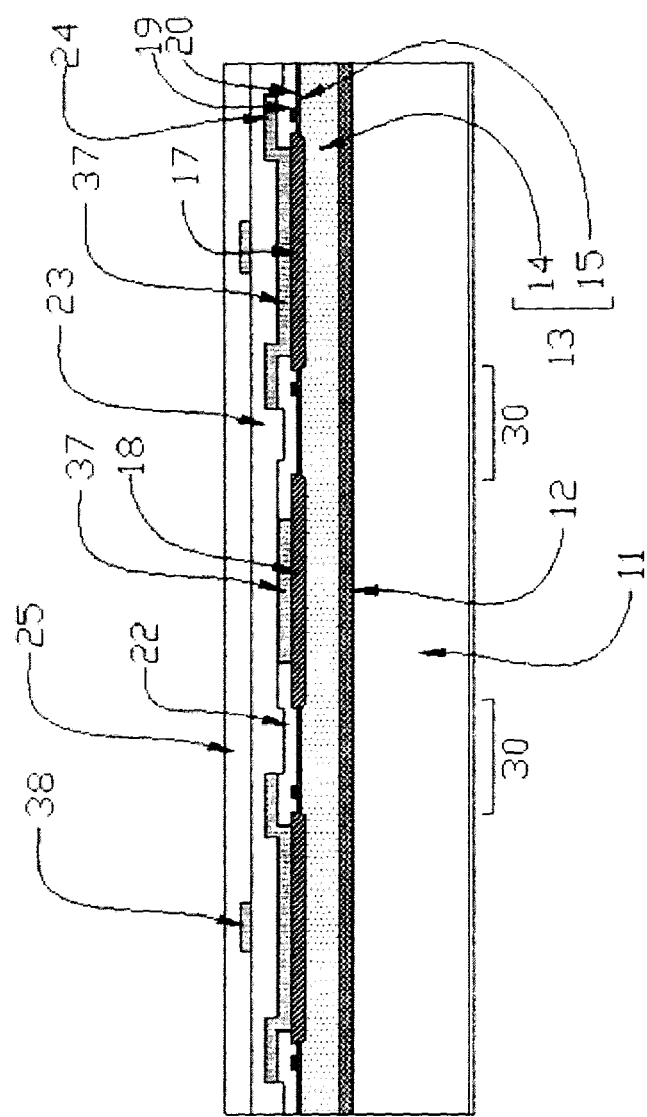
FIG. 2 is a cross-sectional view of the nitride semiconductor device of FIG. 1.

FIG. 2 shows a portion of the cross-sectional structure taken along line II-II in FIG. 1.

As shown in FIG. 2, the nitride semiconductor device has a nitride semiconductor layer 13 formed on a non-conductive substrate 11 with a buffer layer 12 interposed between. The nitride semiconductor layer 13 is formed from an undoped gallium nitride (GaN) layer 14 having a thickness of 1 µm and an undoped aluminum gallium nitride (AlGaN) layer 15 having a thickness of 25 nm. The undoped GaN layer 14 and the undoped AlGaN layer 15 are sequentially formed over the buffer layer 12 in this order. A two-dimensional electron gas (2DEG) is generated in an interface region of the undoped GaN layer 14 with the undoped AlGaN layer 15, forming a channel region.

FIGS. 1 and 2 illustrate a source electrode island 17 and a drain electrode island 18 that are formed spaced apart from each other on the nitride semiconductor layer 13. In order to reduce a contact resistance, the undoped AlGaN layer 15 and a part of the undoped GaN layer 14 are removed in the regions of the source electrode 17 and the drain electrode 18 so that the source electrode 17 and the drain electrode 18 reach a level lower than the interface between the undoped AlGaN layer 15 and the undoped GaN layer 14. The source electrode 17 and the drain electrode 18 are formed from titanium (Ti) and aluminum (Al).

Referring to FIG. 2, a p-type AlGaN layer 20 having a thickness of 200 nm is formed in a stripe shape between the source electrode 17 and the drain electrode 18. A gate electrode 19 is formed on the p-type AlGaN layer 20. The gate electrode 19 is formed from palladium (Pd).

A region comprising a source electrode 17 and drain electrode 18 formed adjacent to each other, with a gate electrode there between in the channel region in the nitride semiconductor layer 13, is referred to as an active interface area 30.

The nitride semiconductor illustrated in FIGS. 1 and 2 is a multi-island field effect transistor (FET). More specifically, each rectangular source electrode island 17 and rectangular drain electrode island 18 have a plurality of active interface areas 30.

A first insulating layer 22 is deposited on top of the gate electrode 19 and active interface areas 30 to provide for a raised source field plate 24 over the gate, the field plate 24 is formed during the gold interconnection metallization process which comes next. In addition, the first insulating layer 22 also provides electrical insulation between the source electrode gold interconnection and the gate electrode 19.

Figure 3:
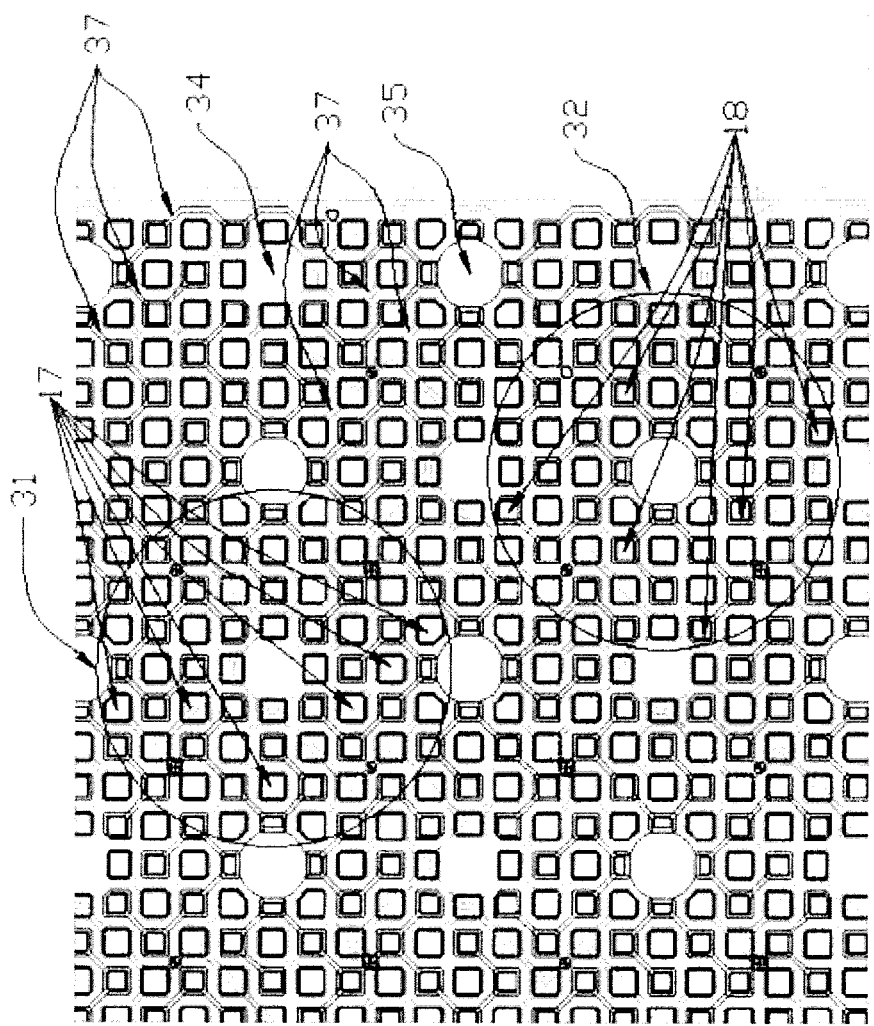
FIG. 3 is a detailed plan view showing the source and drain clusters of the nitride semiconductor device of FIG. 1.

As shown in FIG. 3, a plurality of source island electrodes 17 are electrically connected to each other in clusters of 1 to 50 islands, and form a source cluster 31 with a common electrical interconnection point formed with a source gold bump 34.

As shown in FIG. 3, a plurality of drain island electrodes 18 are electrically connected to each other in clusters of 1 to 50 islands, and form a drain cluster 32 with a common electrical interconnection point formed with a drain gold bump 35.

Figure 4:
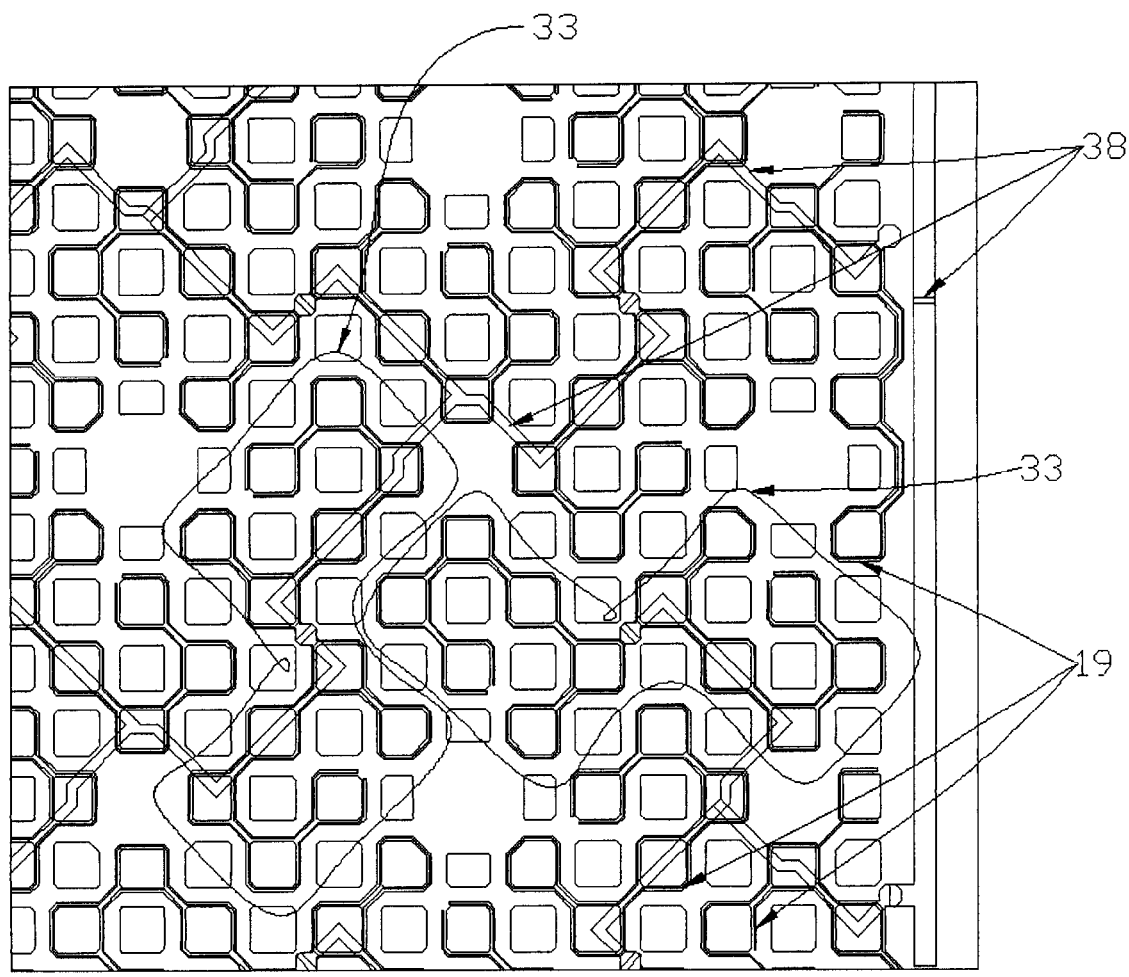
FIGS. 4 and 4a are each a detailed plan view showing the gate clusters of the nitride semiconductor device of FIG. 1, drain and source interconnect have been deleted from this figure to illustrate the gate cluster more clearly.

As shown in FIG. 4, a plurality of gate electrodes 19 are electrically connected to each other in clusters of 1 to 50, thus forming a gate cluster 33, additionally these gate clusters 33 are electrically connected throughout the device by means of gold metalized tracks 37 which terminate with gate gold bumps 36. The gate gold metalized tracks 38 are vertically oriented above the source metal tracks which are at a similar voltage potential, thereby reducing a potential breakdown voltage problem between gate and drain tracks.

A plurality of source clusters 31, drain clusters 32 and gate clusters 33 are arranged so as to be alternately inverted with respect to each drain electrode 18 and source electrode 17, with a gate electrode 19 there between.

The electrical connections between island electrodes are created by means of vias and gold metalized tracks of 1 µm thickness and 3 to 4 µm widths, using one or a plurality of metallization layers, using a lift off resist mask for each layer. The use of multiple metallization layers improves device fabrication yield and reduces metal lift off problems during the fabrication process.

The source gold bump 34, drain gold bump 35 and gate gold bump 36 electrical interconnection points provide distributed electrical current collection points throughout the device for the drain, source and gate electrodes, thereby substantially eliminating the voltage drop variations and electromigration problems found in other power electronic semiconductor devices and permitting the use of standard gold thicknesses and conventional track widths, therefore removing the need for a plurality of the typical die area consuming wide collecting tracks and bonding pads, while still providing all interconnection points on a single device surface.

Figure 4A:
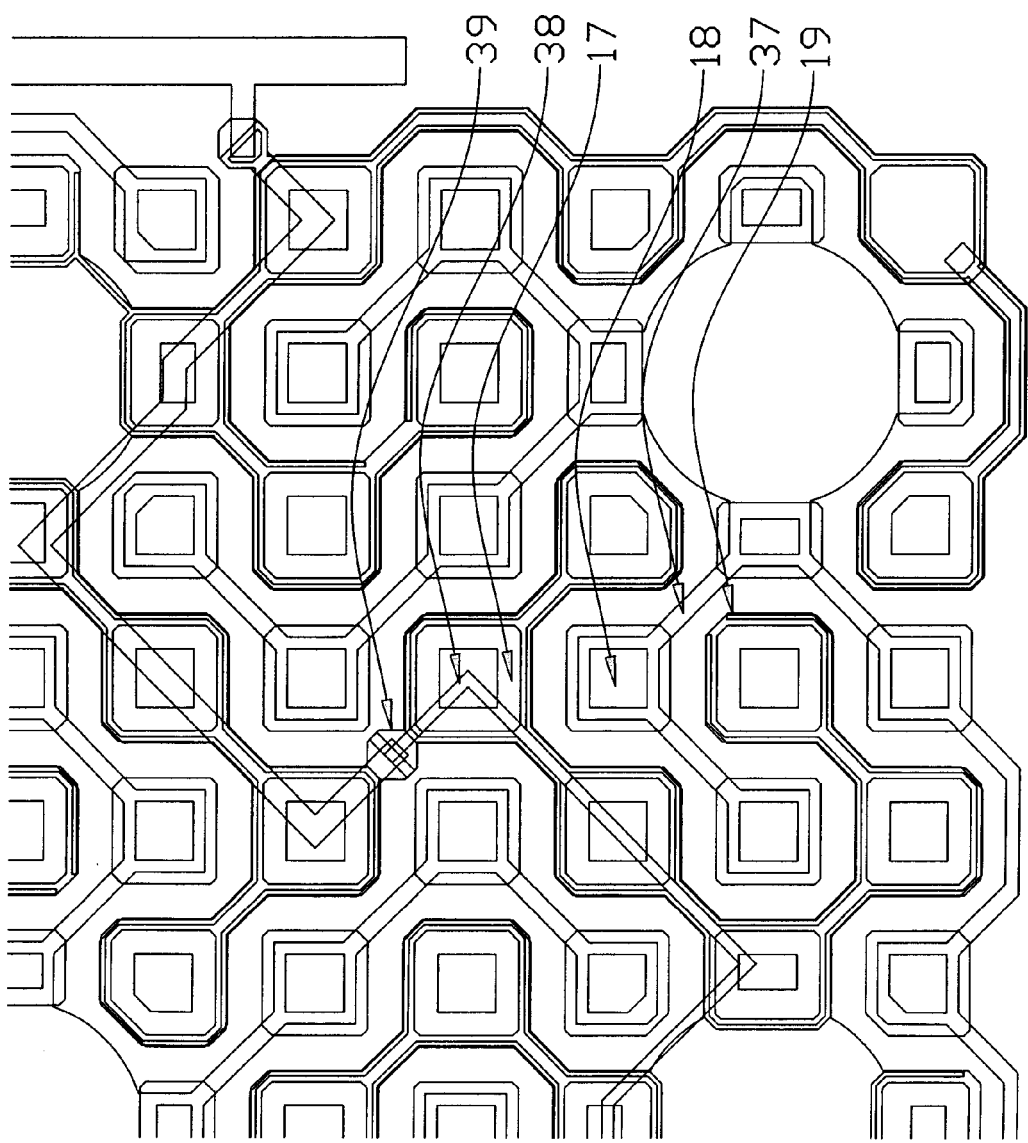

A second insulating layer 23 is deposited after the source and drain gold metallization tracks 37 have been created, to provide insulation between the source gold tracks and the gate gold tracks. Vias are etched out to permit electrical connections from the gate electrode collection points 39 to the gate gold metallization tracks 38, as shown in FIG. 4a.

A third insulating layer 25 is deposited after the gate gold metallization tracks have been created, to protect the die from oxidation. Vias are etched out to at all gold bumps source, drain and gate to permit electrical connections from the gold metalized tracks to the plurality of source, drain and gate gold bumps 34, 35, 36.

Figure 5:
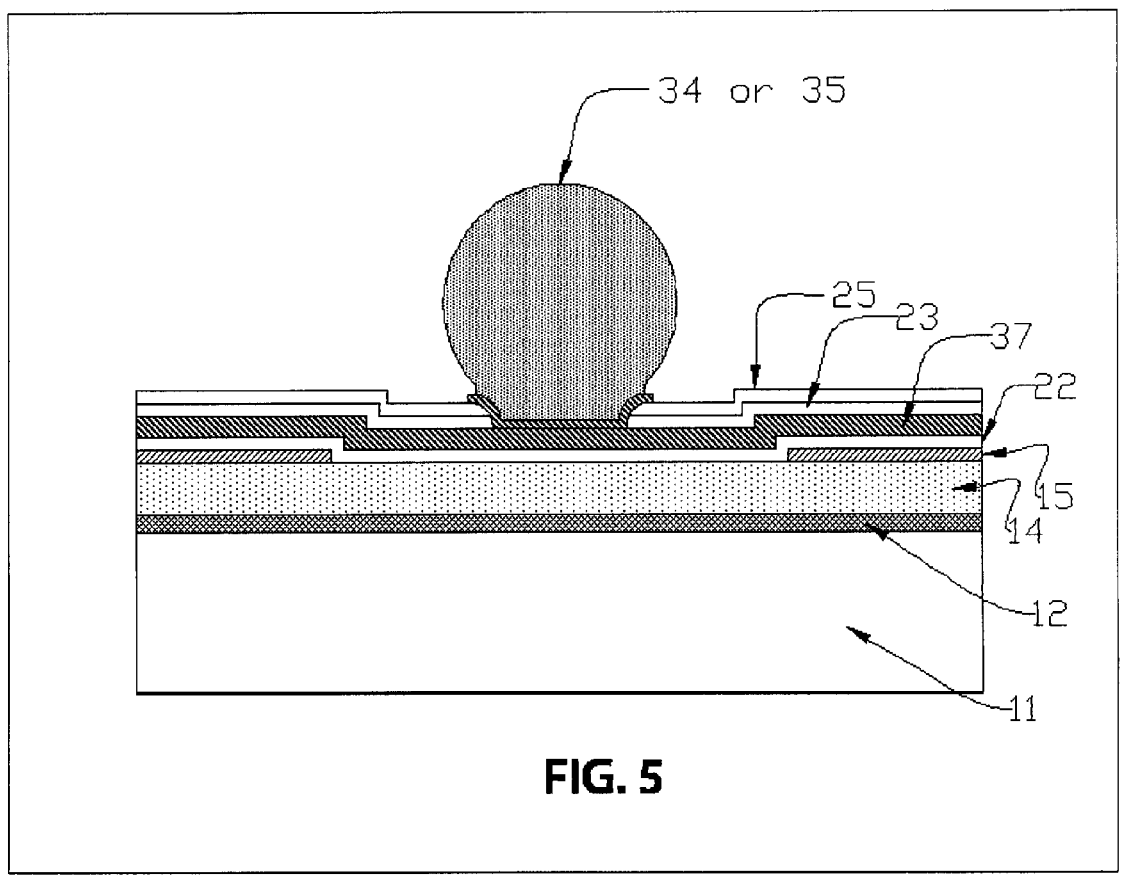
FIG. 5 is a cross-sectional view of a gold bump used in a cluster arrangement.

FIG. 5 shows a portion of the cross-sectional structure taken along line V-V in FIG. 1. In FIG. 5, an example of gold bumps 34, 35 is shown. The present state of the art gold bump technology, which is readily available, has spacing limitations between bump centers; this limits how close the gold bumps can be located to each other on the device. Without this gold bump spacing limit, the present disclosure allows for a gold bump on each island, therefore eliminating the need for inter-island electrical connections provided by the gold metalized tracks 37, thereby maximizing the gate width per area. However, based on available gold bump technology a feasible device may have clusters of typically 24 to 48 island electrodes per gold bump. Larger clusters may also be formed if even greater gold bump spacing was required.

This multi-island structure enables the nitride semiconductor device to have a very wide gate width (Wg), whereby a high power device capable of high current operation can be implemented.

The first, second and third insulating layers 22, 23 and 25 are typically formed from silicon nitride (SiN), having a thickness of 1 μm.

The above example is not limited to using metal for interconnect and may use an material such as silicide/polysilicon to replace the metal interconnect and contact system allowing for a reduction of costs, current hogging, concentrated stresses and electromigration factors.

A silicon carbon (SiC) substrate may be used as the substrate 11 using an orientation that interfaces to the buffer layer 12 with the least lattice mismatch. However, one is not limited to SiC as a substrate, and any substrate may be used as long as the substrate is electrically non-conductive and a nitride semiconductor layer can be grown on the substrate.

The above example describes an enhancement mode FET, a variation of this embodiment may be applied to a depletion mode FET by not including the p-type AlGaN layer 20 in the fabrication process.

One is not limited to external interconnections via gold bumps. Through substrate vias can also be used instead of the gold bumps for either the source or drain electrical connections in the FET, or for the cathode or anode electrical connections for the diode. An electrically-conductive substrate 11 may be used for devices which use through substrate vias.

The following example dimensions are included not to limit the scope, but as to provide further description. First and second island electrodes can be predominately rectangular in shape with 18 μm sides with lateral spacing of 8 μm between adjacent electrodes. Clusters of 24 island electrodes per gold bump connection for both source and drain electrodes, with gate clusters of 50 active segments, can be used.

Example 2

Figure 6:
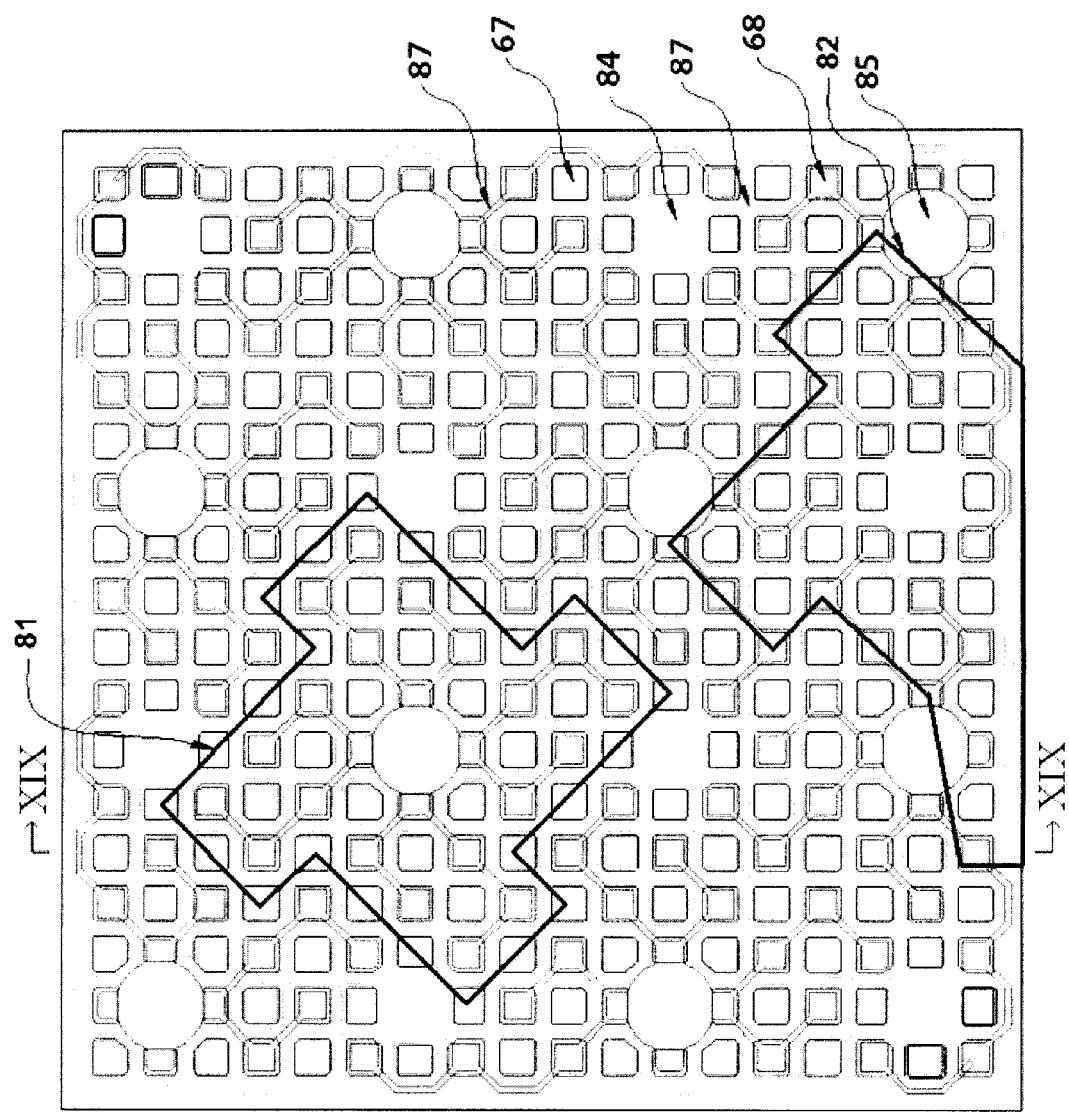
FIG. 6 is a plan view of a nitride semiconductor device according to another exemplary embodiment.
Figure 7:
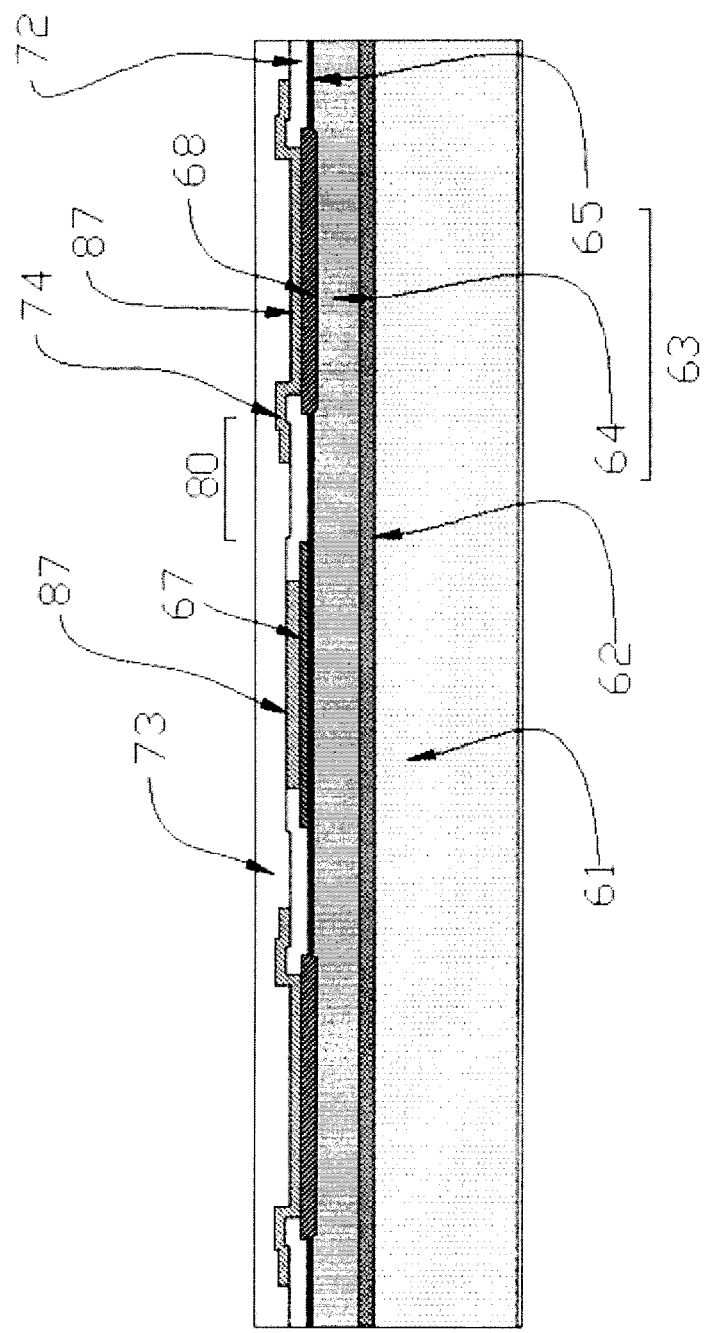
FIG. 7 is a cross-sectional view of the nitride semiconductor device of FIG. 6.

Hereinafter, another exemplary embodiment will be described with reference to the accompanying drawings. FIG. 6 shows a planar structure of a nitride semiconductor device according to another exemplary embodiment. FIG. 7 shows a portion of the cross-sectional structure taken along line VII-VII of FIG. 6.

As shown in FIGS. 6 and 7, the nitride semiconductor device of the second embodiment has a nitride semiconductor layer 63 formed on an electrically non-conductive silicon (SiC) substrate 61 with a buffer layer 62 interposed there between. The nitride semiconductor layer 63 is formed from an undoped gallium nitride (GaN) layer 64 having a thickness of 1 μm and an undoped aluminum gallium nitride (AlGaN) layer 65 having a thickness of 25 nm. The undoped GaN layer 64 and the undoped AlGaN layer 65 are sequentially formed over the buffer layer 62 in this order. A two-dimensional electron gas (2DEG) is generated in an interface region of the undoped GaN layer 64 with the undoped AlGaN layer 65.

A cathode electrode island 67 and an anode electrode island 68 are formed spaced apart from each other on the nitride semiconductor layer 63. The cathode electrode island 67 may be formed from titanium (Ti) and aluminum (Al) and reaches a level lower than the interface between the undoped AlGaN layer 65 and the undoped GaN layer 64. The anode electrode island 68 is formed from palladium (Pd) and is in contact with the top surface of the undoped AlGaN layer 65.

In the present embodiment, a region where a cathode electrode island 67 and anode electrode island 68 are formed adjacent to each other, in the nitride semiconductor layer 63, is referred to as an active interface area 30.

The nitride semiconductor device of this embodiment is a multi-island diode. More specifically, each rectangular cathode electrode island 67 and rectangular anode electrode island 68 have a plurality of active interface areas 30.

A first insulating layer 72 is deposited on top of the active interface areas 30 to provide for a raised anode field plate 74; the field plate 74 is formed during the gold interconnection metallization process which comes next.

A plurality of cathode electrode islands 67 are electrically connected, by means of gold metalized tracks 87, to each other in clusters of 1 to 50 islands, and form a cathode cluster 81 with a common electrical interconnection point formed with a cathode gold bump 84.

A plurality of anode electrode islands 68 are electrically connected, by means of gold metalized tracks 87, to each other in clusters of 1 to 50 islands, and form an anode cluster 82 with a common electrical interconnection point formed with a anode gold bump 85.

A plurality of cathode clusters 81 and anode clusters 82 are arranged so as to be alternately inverted with respect to each cathode electrode 67 and anode electrode 68, thereby creating the maximum number of active interface areas 30.

The electrical connections between island electrodes, the gold bump technology, through substrate vias and substrate used in this example are the same as those used within the first example, with the same extensions described therein also applying here.

This structure enables the nitride semiconductor device of this example to have a very large collective active interface between cathode and anode electrodes, whereby a high power device capable of high current operation can be implemented.

A second insulating layer 73 is formed on the device except in the areas where the cathode gold bumps 84 and the anode gold bumps 85 are to be placed. The second insulating layer 73 is provided to stabilize the surface of the device and is formed from silicon nitride (SiN), having a thickness of 1 μm.

Figure 8:
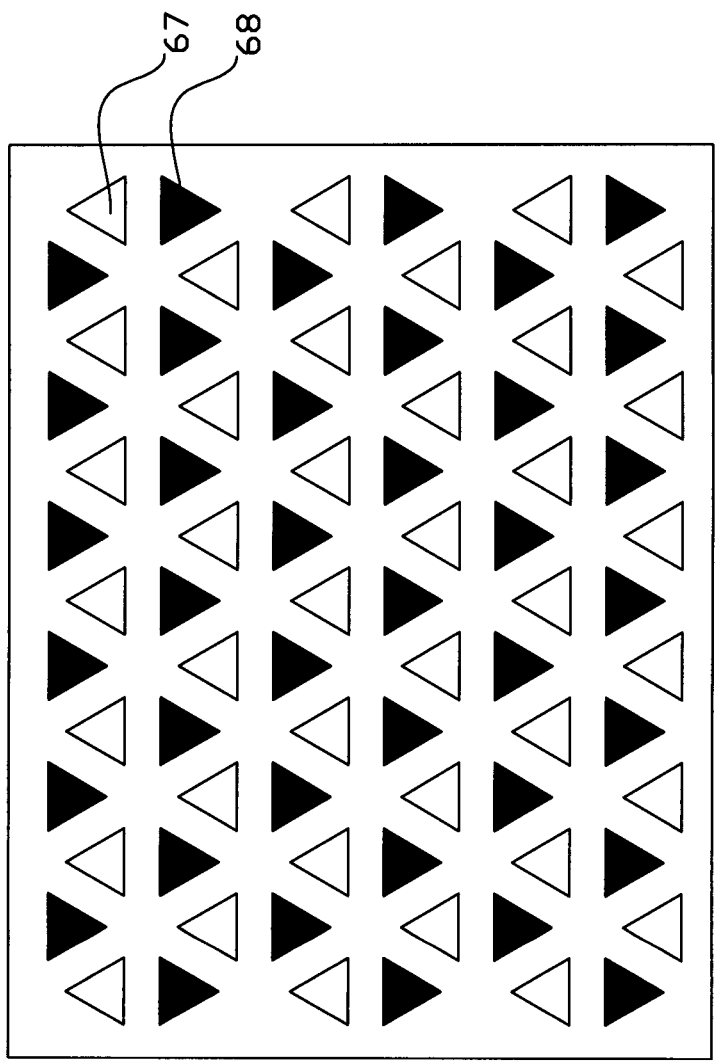
FIG. 8 is a plan view of a modification, using triangular shaped electrodes, of a nitride semiconductor device of FIG. 6.

As an example of an alternative to the rectangular island electrode structure described in the first and second examples, a triangular electrode island shape (67, 68) may be used, as shown in plan view in FIG. 8, where a portion of a nitride semiconductor diode is illustrated. Similar structures with gate electrodes between the source and drain electrode islands are also within the scope of the present disclosure.

Example 3

Figure 9:
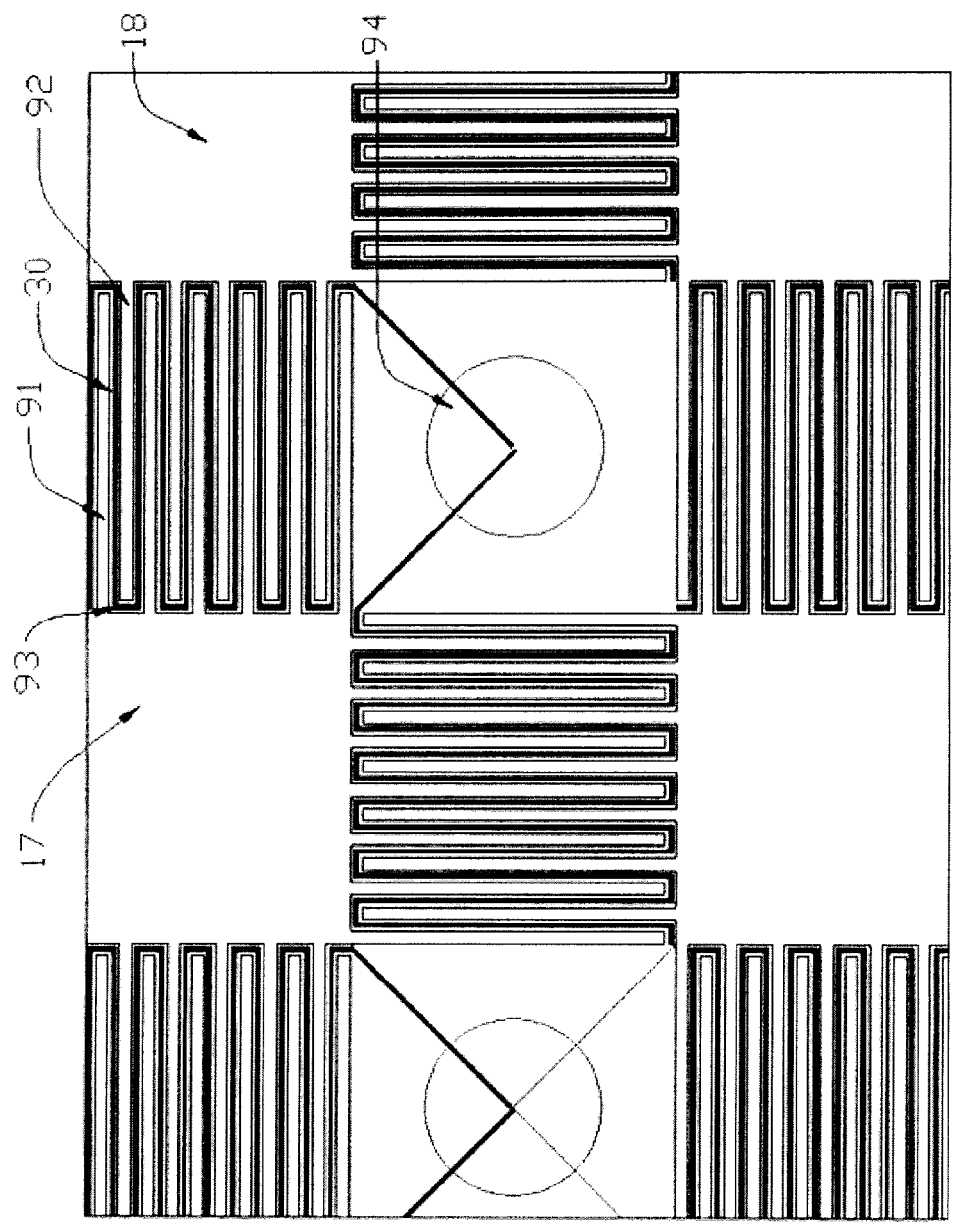
FIG. 9 is a plan view of a modification using castellated peninsulas from each side of the islands of a nitride semiconductor device according to yet another embodiment.

Hereinafter, yet another exemplary embodiment will be described with reference to the accompanying drawings. The process steps used to form this embodiment are similar to the steps employed in the first two examples. FIG. 9 shows a plan view of a portion of a planar structure of a nitride semiconductor device according to a third embodiment, wherein the plurality of simple rectangular island electrode shapes have been castellated (or crenulated). The castellated peninsulas 91 from the first electrode islands are interleaved with the castellated peninsulas 92 from the second electrode islands to increase the active interface area 30 between each type of electrode. Within these active interface areas between the first and second electrodes, a third stripe shaped electrode 93 is deposited to form the gate electrode of a nitride transistor.

Similar diode structures without the gate electrodes between the electrode islands' castellated peninsulas are also within the scope of the disclosure.

The castellated peninsulas 91 and 92, which are shown in rectangular shape in FIG. 9, can alternatively be of a tapered trapezoidal shape to improve the electromigration problems that pertain to any high current applications. The castellated peninsulas can also have gold or other metal centered along them to increase their electrical current handling capabilities. Transistors made using the structure shown in FIG. 9 can provide two to three times lower on-resistance than the simple island structure for practical low voltage semiconductor implementations, using smaller electrode spacing.

The structure shown in FIG. 9 is well suited to flip-chip electrode electrical connections by using the gold bumps, discussed previously. The plurality of gold or other conductive metal electrical connections 94 to the gate electrodes at regular intervals, substantially improves the switching speed and switching delay time of these nitride transistors.

An alternative to the rectangular island electrode structure described in the third embodiment, a triangular electrode island shape with castellated peninsulas may be used, either with or without gate electrodes, to create either transistors or diodes.

Figure 10:
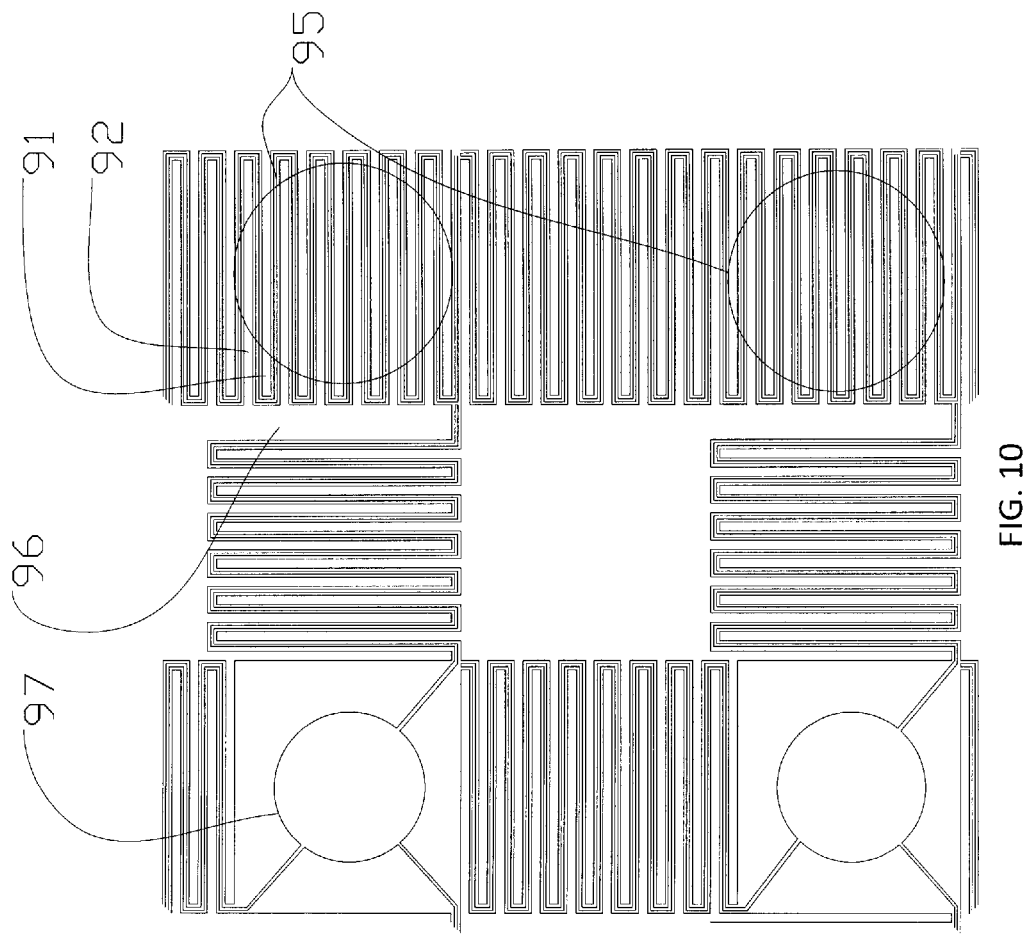
FIG. 10 is a plan view of an additional modification using castellated peninsulas from each side of the islands of a nitride semiconductor device according of FIG. 9.
Figure 11:
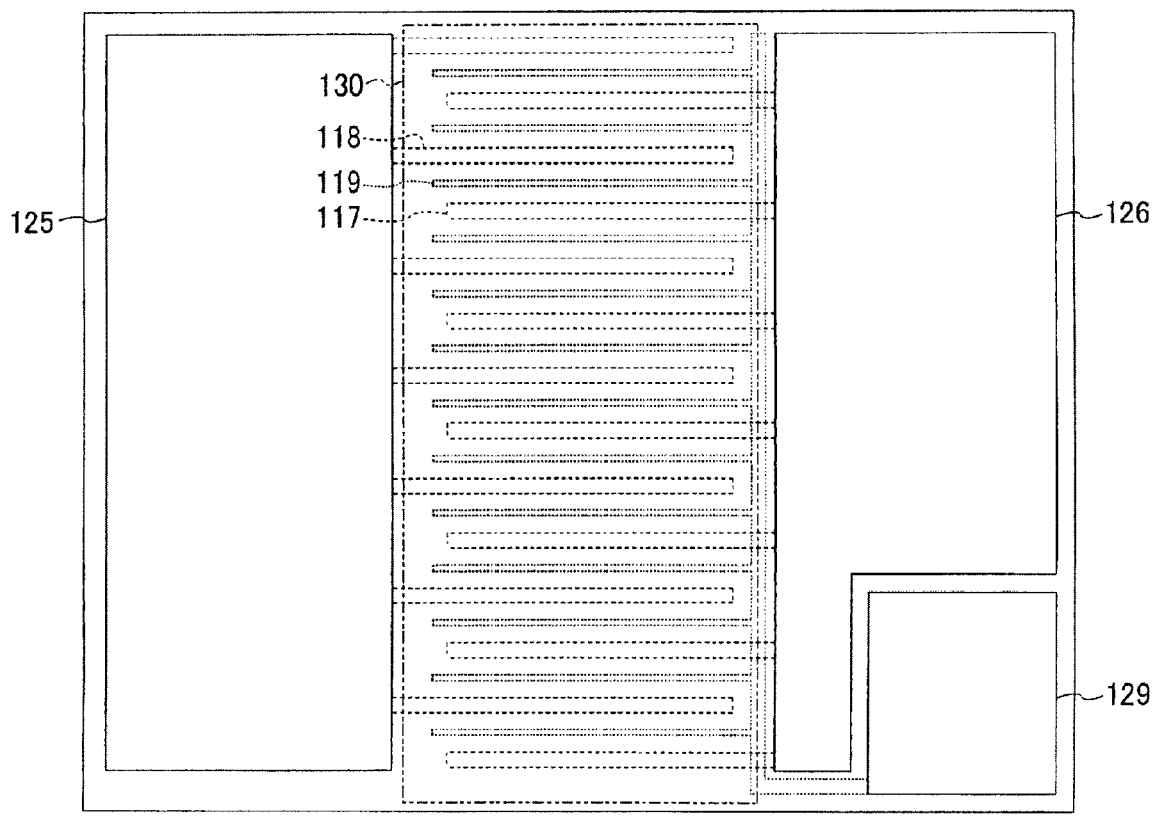
FIG. 11 is a plan view of a conventional nitride semiconductor device.

As an additional modification to the castellated peninsulas described in the third embodiment, a plurality of additional active interface areas 30 can be created by extending the castellated peninsulas into those areas 95 from the adjacent island electrodes, as shown in FIG. 10. This increases the gate length and current handling capability by up to an additional 25%. Typically the increase may be less to enable creation of wider peninsulas 96 to handle the current from the additional interleaved peninsulas 91, 92. The resulting semiconductor devices can be formed with or without gate electrodes, to create either transistors or diodes. In the diode application, or in cases where transistor gate speed is not critical, the increase in current handling capability may be up to almost 50% since the other non-active area 97 may also be used for additional peninsulas if it is not required for gate connections.

As described above, disclosed herein is implementation of a series of devices that have a smaller overall area while providing all the electrode connections and all the means of mounting of a real device within the overall area while also maximizing the useful active area. Diodes and transistors made in this manner usefully lower the cost of manufacture while reducing the size of power systems.

It will be understood that the disclosure is not limited to the particular embodiments described herein, but is capable of incorporation various modifications, rearrangements, and substitutions as will now become apparent to those skilled in the art.

CONCLUSION

The claims, and the language used therein, are to be understood in terms of the variants which have been described. They are not to be restricted to such variants, but are to be read as covering the full scope as is implicit within the disclosure that has been provided herein.

What is claimed is:

1. A nitride semiconductor device comprising:
   a) a substrate;
   b) a nitride semiconductor layer formed on a main surface of the substrate, the nitride semiconductor layer having a channel region through which electrons drift in a direction parallel to the main surface;
   c) a plurality of first island electrodes and a plurality of second island electrodes formed on the nitride semiconductor layer, spaced apart from each other and arranged alternately to produce a multiplicity of two-dimensional active regions in the nitride semiconductor layer, wherein the first and second island electrodes are, respectively, source and drain electrodes of a multi-island transistor, or, anode and cathode electrodes of a multi-island diode;
   d) an insulating layer formed on the nitride semiconductor layer having a plurality of openings for connections to the first and second island electrodes and any common electrode connections areas;
   e) a plurality of ball or bump connections connected through the plurality of openings to either of respective first or second island electrodes; and
   wherein a plurality of through-substrate via connections are formed where the first or second island electrodes or common electrode connection areas are not connected using a ball or bump connections, a large single electrode common pad is provided on a side of the substrate opposite the main surface, and the plurality of through-substrate via connections provide connections from a top of the first or second island electrodes or from respective common electrode connection areas to the common pad.

2. The nitride semiconductor device according claim 1, wherein the first and second island electrodes have a rectangular shape.

3. The nitride semiconductor device according to claim 1, wherein the first and second island electrodes have a triangular shape.

4. The nitride semiconductor device according to claim 1, wherein the first and second island electrodes are a combination of various different polygon shapes to optimize active area usage.

5. A nitride semiconductor device comprising:
   a) a substrate
   b) a nitride semiconductor layer formed on a main surface of the substrate, the nitride semiconductor layer having a channel region through which electrons drift in a direction parallel to the main surface;
   c) a plurality of first island electrodes and a plurality of second island electrodes formed on the nitride semiconductor layer, spaced apart from each other and arranged alternately to produce a multiplicity of two-dimensional active regions in the nitride semiconductor layer, wherein the first and second island electrodes are, respectively, source and drain electrodes of a multi-island transistor, or, anode and cathode electrodes of a multi-island diode;
   d) an insulating layer formed on the nitride semiconductor layer having a plurality of openings for connections to the first and second island electrodes and any common electrode connections areas; and
   e) a plurality of ball or bump connections connected through the plurality of openings to the respective first and second island electrodes;
   wherein
   a single or a plurality of first metal layers allow for electrical connection of a plurality of first island electrodes to a common first electrode gold bump connection; and
   a single or a plurality of second metal layers allow for electrical connection of a plurality of second island electrodes to a common second electrode gold bump connection.

6. The nitride semiconductor device according to claim 5, wherein the first and second metal layers provide separation of high voltage stresses between the first and second electrodes and their connections.

7. The nitride semiconductor device according to claim 5 wherein the first and second metal layers are fabricated by a lift-off resist mask process.

8. The nitride semiconductor device according to claim 1 wherein the substrate is conductive and via connections are provided from either a top of each first island electrode or a top of each second island electrode, or from a top of each respective common connection area, to the substrate.

9. The nitride semiconductor device according to claim 1, comprising a silicide/polysilicon interconnect and contact system or a metal interconnect and contact system.

10. The nitride semiconductor device according to claim 1 wherein the first and second island electrodes are made from two metal layers of different work functions.

11. A nitride semiconductor device comprising:
a) a substrate;
b) a nitride semiconductor layer formed on a main surface of the substrate, the nitride semiconductor layer having a channel region through which electrons drift in a direction parallel to the main surface;
c) a plurality of first island electrodes and a plurality of second island electrodes formed on the nitride semiconductor layer, spaced apart from each other and arranged alternately to produce a multiplicity of two-dimensional active regions in the nitride semiconductor layer, wherein the first and second island electrodes are, respectively, anode and cathode electrodes of a multi-island diode;
d) an insulating layer formed on the nitride semiconductor layer having a plurality of openings for connections to the first and second island electrodes and any common electrode connections areas; and
e) a plurality of ball or bump connections connected through the plurality of openings to the respective first and second island electrodes; and
wherein, the plurality of first island electrodes and the plurality of second island electrodes each have a plurality of castellated peninsulas extending from at least one side, the castellated peninsulas of first island electrodes being interleaved with castellated peninsulas of adjacent second island electrodes.

12. A nitride semiconductor device comprising:
a) a substrate;
b) a nitride semiconductor layer formed on a main surface of the substrate and having a channel region through which electrons drift in a direction parallel to the main surface;
c) a plurality of first island electrodes and a plurality of second island electrodes formed on the nitride semiconductor layer, spaced apart from each other and arranged alternately to produce two dimensional active regions in the nitride semiconductor layer;
d) a plurality of third strip electrodes that are formed on the nitride semiconductor layer in regions between each first island electrode and each second island electrode and serve as gate electrodes of a multi-island field effect transistor, where each of the island electrodes is either a drain electrode or a source electrode of a field effect transistor;
e) an insulating layer formed on the nitride semiconductor layer having a plurality of openings for connections to the first, second, third electrodes and any common electrode connection areas which have been formed by electrically connecting the first and second and third electrodes; and
f) a plurality of ball or hump connections connected through the plurality of openings to the respective first and second and third electrodes and any common electrode connection areas; and wherein:
the plurality of first island electrodes and the plurality of second island electrodes each have a plurality of castellated peninsulas extending from at least one side, the castellated peninsulas of the first island electrodes being interleaved with castellated peninsulas of adjacent second island electrodes; and
the plurality of third strip electrodes that are formed on the nitride semiconductor layer in regions between interleaved castellated peninsulas of the first and second island electrodes and serve as gate electrodes of a multi-island field effect transistor, where each of the island electrodes is either a drain electrode or a source electrode of a field effect transistor.

13. The nitride semiconductor device according to claim 12 wherein a layer of p-type GaN material or a layer of p-type AlGaN material is provided under the gate electrode to create an enhancement device.

14. The nitride semiconductor device of claim 12 wherein the nitride semiconductor layer comprises a heterolayer consisting of a layer of undoped gallium nitride (GaN) and an overlying layer undoped aluminum gallium nitride (AlGaN).

* * * * *